United States Patent
Mungai et al.

(10) Patent No.: US 11,692,267 B2
(45) Date of Patent: Jul. 4, 2023

(54) PLASMA INDUCED MODIFICATION OF SILICON CARBIDE SURFACE

(71) Applicant: Applied Materials, Inc., Santa Clara, CA (US)

(72) Inventors: Francis Kanyiri Mungai, San Jose, CA (US); Vijayabhaskara Venkatagiriyappa, Bangalore (IN); Yung-Cheng Hsu, New Taipei (TW); Keiichi Tanaka, San Jose, CA (US); Mario D. Silvetti, Morgan Hill, CA (US); Mihaela A. Balseanu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1 day.

(21) Appl. No.: 17/139,211

(22) Filed: Dec. 31, 2020

(65) Prior Publication Data
US 2022/0205095 A1    Jun. 30, 2022

(51) Int. Cl.
*C23C 16/32* (2006.01)
*C23C 16/455* (2006.01)
*H01L 21/687* (2006.01)
*C23C 16/458* (2006.01)

(52) U.S. Cl.
CPC ...... *C23C 16/45536* (2013.01); *C23C 16/325* (2013.01); *C23C 16/4582* (2013.01); *C23C 16/45544* (2013.01); *H01L 21/68757* (2013.01)

(58) Field of Classification Search
CPC ............ C23C 16/325; C23C 16/45536; C23C 16/45544; C23C 16/4582
See application file for complete search history.

(56) References Cited

U.S. PATENT DOCUMENTS

| | | | |
|---|---|---|---|
| 5,904,778 A | 5/1999 | Lu et al. | |
| 6,262,386 B1 | 7/2001 | Förnsel | |
| 6,872,259 B2 | 3/2005 | Strang et al. | |
| 8,398,783 B2 | 3/2013 | Lee et al. | |
| 2008/0018841 A1 | 1/2008 | Rho et al. | |
| 2008/0129208 A1* | 6/2008 | Kumar | C23C 26/02 219/121.36 |
| 2010/0028572 A1 | 2/2010 | Kobayashi et al. | |
| 2013/0022752 A1* | 1/2013 | Antonakas | C23C 16/0245 427/535 |

(Continued)

FOREIGN PATENT DOCUMENTS

| | | | | |
|---|---|---|---|---|
| CN | 108249429 A | * | 7/2018 | ........... C01B 32/194 |
| EP | 0821397 A2 | * | 7/1997 | .............. H01J 37/32 |

(Continued)

OTHER PUBLICATIONS

Rodriguez-Santiago, Victor, et al., "Modification of Silicon Carbide Surfaces by Atmospheric Pressure Plasma for Composite Applications". Applied Materials & Interfaces, 2013, 5, 4725-4730.*

(Continued)

*Primary Examiner* — Bret P Chen
(74) *Attorney, Agent, or Firm* — Servilla Whitney LLC

(57) ABSTRACT

Methods for modifying a susceptor having a silicon carbide (SiC) surface comprising exposing the silicon carbide surface (SiC) to an atmospheric plasma are described. The method increases the atomic oxygen content of the silicon carbide (SiC) surface.

15 Claims, 3 Drawing Sheets

(56) References Cited

U.S. PATENT DOCUMENTS

| | | | | |
|---|---|---|---|---|
| 2013/0099170 A1* | 4/2013 | Zaldivar | ............... | C08K 3/04 252/500 |
| 2018/0339281 A1* | 11/2018 | Tehranchi | ............. | G02B 6/1225 |
| 2019/0013230 A1 | 1/2019 | Taga et al. | | |
| 2020/0340102 A1 | 10/2020 | Kimura et al. | | |

FOREIGN PATENT DOCUMENTS

| | | | | | |
|---|---|---|---|---|---|
| KR | 20090077264 A | | 7/2009 | | |
| KR | 20110024456 A | | 3/2011 | | |
| KR | 20110061932 A | | 6/2011 | | |
| KR | 20120041475 A | | 5/2012 | | |
| KR | 20130133489 A | | 12/2013 | | |
| KR | 10-2014-0100615 | * | 8/2014 | ............... | C08J 7/18 |
| WO | WO 2014/143731 | * | 9/2014 | ............... | C08J 7/12 |
| WO | WO 2015/089069 A1 | * | 6/2015 | ............. | C07C 27/06 |

OTHER PUBLICATIONS

Lai, Jiangnan, et al., "Study on hydrophilicity of polymer surfaces improved by plasma treatment". Applied Surface Science 252 (2006) 3375-3379.*

Jokinen, Ville, et al., "Oxygen and nitrogen plasma hydrophilization and hydrophobic recovery of polymers". Biomicrofluidics. vol. 6, Issue 1, 2012, pp. 1-23.*

Hong, Sung M., et al., "Hydrophilic Surface Modification of PDMS Using Atmospheric RF Plasma". 2006 J. Phys.: Conf. Ser. 34 (2006) 656-661.*

Ye, Ximing, et al., "Plasma-enhanced Si-SiC low-temperature bonding based on graphene composite slurry interlayer". Materials Letters 293 (2021) 129710, pp. 1-4.*

Rodriguez-Santiago, Victor, et al., "Modification of Silicon Carbide Surfaces by Atmospheric Pressure Plasma for Composite Applications". ACS Appl. Mater. Interfaces 2013, 5, 4725-4730.*

Kim, Jung Gon, et al., "Quantitative Analysis of Contact Angle of Water on SiC: Polytype and Polarity Dependence". ECS Journal of Solid State Science and Technology, 2020 9 (12) 123006, pp. 1-5.*

Petrov, G. M., et al., "Modeling of a two stage RF plasma reactor for SiC deposition," ICOPS 2000. IEEE Conference Record. 27th IEEE International Conference on Plasma Science (Cat. No. 00CH37087), New Orleans, LA, USA, 2000, 1 page. Abstract Only.*

PCT International Search Report and Written Opinion in PCT/US2021/065433 dated Apr. 21, 2022, 13 pages.

* cited by examiner

PLASMA INDUCED MODIFICATION OF SILICON CARBIDE SURFACE

TECHNICAL FIELD

The present disclosure relates generally to apparatus and methods for modifying silicon carbide (SiC) surfaces. In particular, embodiments of the disclosure are directed to apparatus and methods for improving the surface of a susceptor.

BACKGROUND

A susceptor surface of a semiconductor processing chamber (e.g., an Atomic Layer Deposition (ALD) chamber) is modified by plasma treatment to improve SiC surface hydrophilicity and consequently, adhesion of films deposited in semiconductor processing chamber. Plasma based surface treatment process can often result in scorching, burning and/or arcing damage. The damage results in unintended reduction in hydrophilicity, wettability and the adhesive properties and degradation of the aesthetic requirements of the susceptor surface.

Accordingly, there is a need in the art for apparatus and methods to improve and/or preserve surface properties of the susceptor.

SUMMARY

One or more embodiments of the disclosure are directed to methods of increasing hydrophilicity of a silicon carbide (SiC) surface, the method comprising exposing the silicon carbide surface to an atmospheric plasma.

Additional embodiments of the disclosure are directed to methods of modifying a susceptor surface comprising silicon carbide (SiC), the method comprising increasing an atomic oxygen content of the susceptor surface.

Further embodiments of the disclosure are directed to plasma treatment apparatus comprising a susceptor holding assembly and a plasma nozzle. The susceptor holding assembly comprises a fixed stage that is isolated from electrical ground. The plasma nozzle is spaced a distance from the fixed stage. The plasma nozzle comprises an anode, a cathode, a gas inlet, a gas flow path and a plasma outlet. The gas flow path separates the anode and cathode so that plasma is generated in the gas flow path prior to exiting the plasma outlet toward the fixed stage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
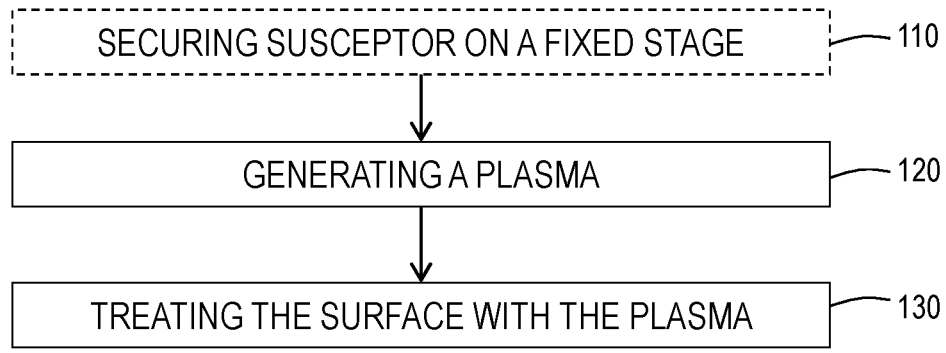
FIG. 1 shows a method for increasing hydrophilicity of a surface according to one or more embodiments of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, a film/layer is deposited on a substrate surface by an atomic layer deposition (ALD) process. In such embodiments, the process comprises securing the substrate on a top surface of a susceptor and depositing the film/layer by the atomic layer deposition (ALD) process. The susceptor and the substrate are exposed to the precursors (or reactive gases) sequentially or substantially sequentially during the process. As used herein throughout the specification, "substantially sequentially" means that a majority of the duration of a precursor exposure (also referred to as a pulse) does not overlap with the exposure to a co-reactant, although there may be some overlap. As used in this specification and the appended claims, the terms "precursor", "reactant", "reactive gas" and the like are used interchangeably to refer to any gaseous species that can react with the substrate surface or with a film on the substrate surface.

A susceptor surface in a semiconductor processing chamber is often exposed to extreme conditions which result in damage to the susceptor. For example, some processes cause the top susceptor surface to be scorched, burned or damaged due to arcing. The damage reduces hydrophilicity, wettability and adhesive properties of the top susceptor surface. Without being bound by any particular theory of operation, it is believed that some of the damage is due to electronic coupling between the susceptor and the plasma source electrodes. Accordingly, in some embodiments of the disclosure, the susceptor is floating. As used in this manner, the term "floating" means that the stated component is electrically isolated from ground sufficient to prevent electric coupling and arcing.

In some embodiments, the surface comprises a top surface of a susceptor. In some embodiments, the top surface of the susceptor comprises silicon carbide (SiC). In some embodiments, the surface being modified comprises silicon carbide (SiC). Accordingly, one or more embodiments of the disclosure are directed methods of modifying a susceptor surface. Some embodiments are directed to methods of modifying a silicon carbide (SiC) surface. Some embodiments are directed to methods of modifying a susceptor with a silicon carbide (SiC) surface.

In some embodiments, the silicon carbide (SiC) surface is a silicon carbide layer formed on a graphite substrate. In some embodiments, the graphite substrate is a process chamber susceptor. In some embodiments, the silicon carbide (SiC) surface has a thickness in the range of 100 nm to 500 µm, or in the range of 500 nm to 400 µm, or in the range of 1 µm to 300 µm, or in the range of 10 µm to 250 µm, or in the range of 50 µm to 200 µm, or in the range of 100 µm to 150 µm In some embodiments, the method comprises increasing an atomic oxygen content of the silicon carbide (SiC) surface. In some embodiments, increasing the atomic oxygen content of the silicon carbide (SiC) surface increases one or more of hydrophilicity of the silicon carbide (SiC) surface, wettability of the silicon carbide (SiC) surface or an adhesion property of the silicon carbide (SiC) surface.

In some embodiments, the silicon carbide surface has an initial oxygen content of less than 20%, 18%, 16%, 14%, 12%, 10%, 8%, 6%, 4%, 2% or 1% on an atomic basis. In some embodiments, the atomic oxygen content of the silicon carbide (SiC) surface is increased from the initial oxygen content to an amount in a range of 10% to 70%, or 20% to 67%, or 30% to 65%, or 40% to 60%, or 50% to 58% on an atomic basis. In some embodiments, the oxygen content is measured using x-ray photoelectron spectroscopy (XPS) to a depth up to about 100 Å.

In some embodiments, the increased oxygen content of the silicon carbide surface extends a distance in to the silicon carbide surface. Stated differently, the oxygen atoms penetrate the silicon carbide surface up to a depth. In some embodiments, the atomic oxygen penetrates to a depth of up to 30 nm, 25 nm, 20 nm, 15 nm, 10 nm, 5 nm, 4 nm, 3 nm or 2 nm. In some embodiments, 90% of the added atomic oxygen is present within a depth from the surface of up to 30 nm, 25 nm, 20 nm, 15 nm, 10 nm, 5 nm, 4 nm, 3 nm or 2 nm.

In some embodiments, the atomic oxygen content is increased by treating the silicon carbide (SiC) surface with an atmospheric plasma treatment. In some embodiments, the atomic oxygen content is increased using an atmospheric plasma treatment. As used in this specification and the appended claims, the term "atmospheric plasma" refers to a plasma generated at a pressure greater than or equal to 500 Torr, 600 Torr, 700 Torr, 750 Torr or 755 Torr and less than or equal to 1000 Torr, 900 Torr, 800 Torr or 765 Torr, or in the range of 500 Torr to 1000 Torr, or in the range of 600 Torr to 900 Torr, or in the range of 700 Torr to 800 Torr, or in the range of 725 Torr to 775 Torr, or in the range of 750 Torr to 770 Torr. In some embodiments, "atmospheric pressure" refers to an ambient or uncontrolled pressure environment.

According to one or more embodiments of the disclosure, the atmospheric plasma treatment increases hydrophilicity of a susceptor surface. In some embodiments, the method increases the atomic content of oxygen in the silicon carbide surface to increase the hydrophilicity of the silicon carbide surface. One or more embodiments of the method 100 advantageously prevent burning of the subject material. Some embodiments advantageously prevent scorching of the subject material. Some embodiments advantageously increase wettability of the subject material. Some embodiments advantageously improve adhesive properties of the subject material.

FIG. 1 illustrates a method 100 for increasing hydrophilicity of the component surface (e.g., a susceptor surface) according to one or more embodiments of the disclosure. In some embodiments, the method 100 comprises the optional process of securing the component on a fixed stage 110, generating a plasma 120 and treating the surface with the plasma 130. Embodiments of the disclosure are described with respect to the treatment of a susceptor surface. However, the skilled artisan will recognize that this is merely for descriptive purposes and the component is not limited to susceptors and susceptor surfaces.

Figure 2:
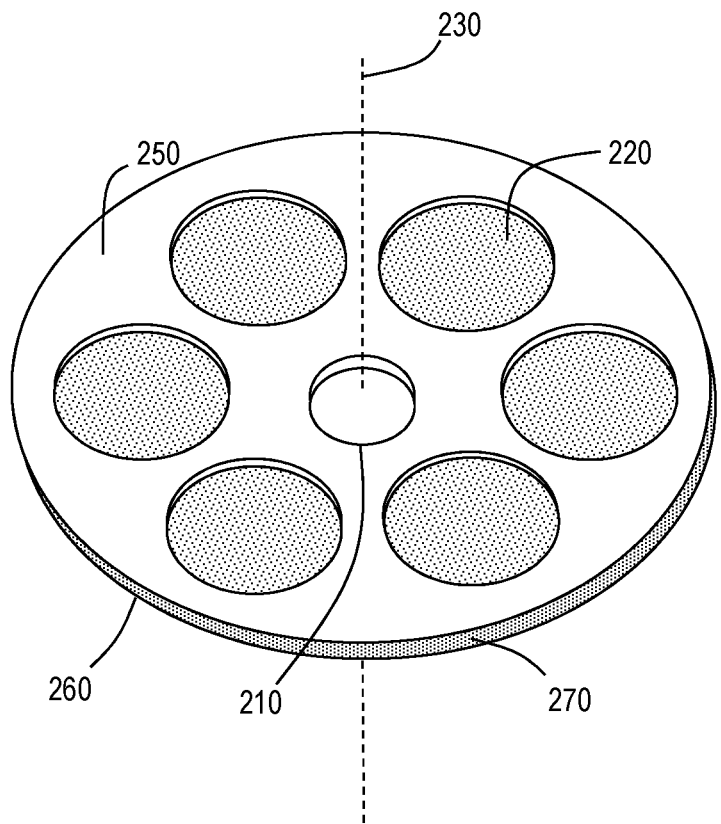
FIG. 2 show an isometric view of a susceptor according to one or more embodiments of the disclosure.

FIG. 2 illustrates an exemplary susceptor 200 according to one or more embodiments of the disclosure. In the illustrated embodiment, the susceptor 200 has a top surface 250 and a bottom surface 260 defining a thickness of the susceptor 200. The susceptor 200 illustrated has an outer peripheral edge 270 with an inner opening 210. The top surface 250 of the illustrated embodiment includes a plurality of spaced pockets 220 spaced around a central axis 230. The skilled artisan will recognize that the embodiment shown in FIG. 2 is merely representative of one possible component for use with embodiments of the disclosure and should not be taken as limiting the scope of the disclosure. According to one or more embodiments of the disclosure, the top surface 250 of the susceptor 200 is treated using a method 100 according to FIG. 1. In some embodiments, the top surface 250 of the susceptor 200 comprises silicon carbide (SiC).

Figure 3:
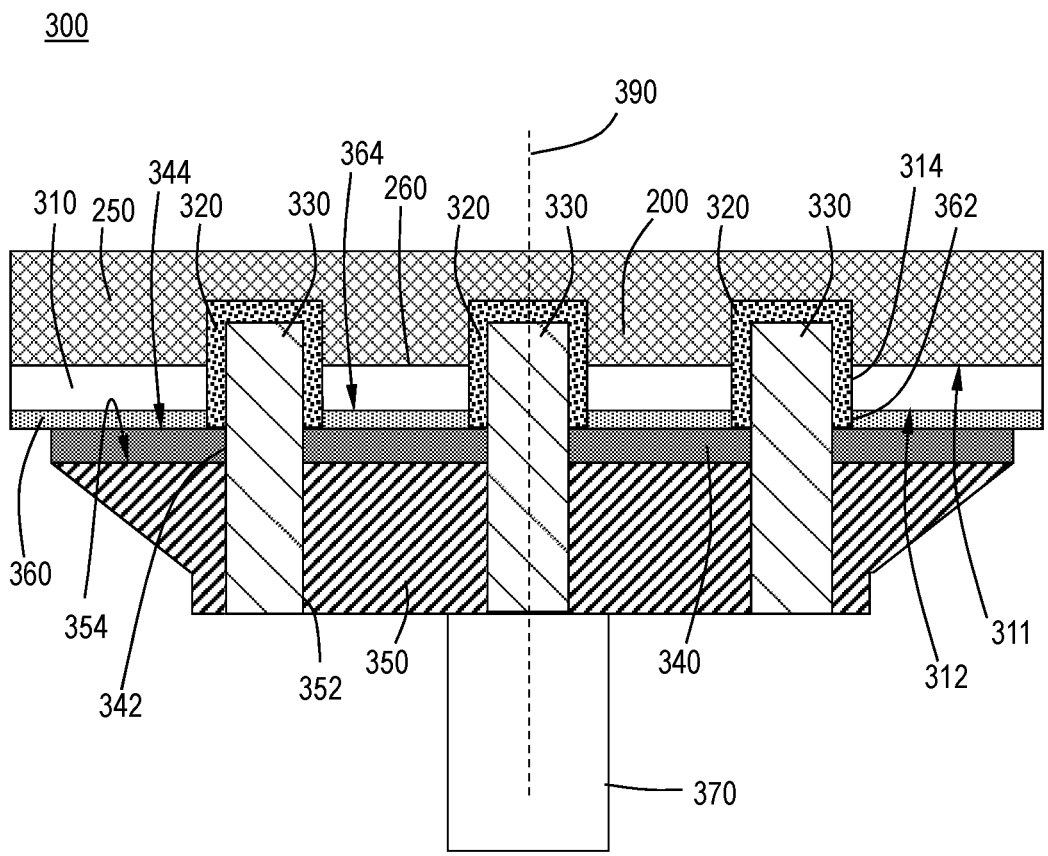
FIG. 3 illustrates a schematic cross-sectional view of a support assembly according to one or more embodiments of the disclosure.

FIG. 3 illustrates an exemplary support assembly 300 with a susceptor 200 positioned for treatment according to one or more embodiment of the disclosure. Method 100 (see FIG. 1) includes an optional process 110 of securing the component (e.g., susceptor 200) to a fixed stage 310. In some embodiments, the method 100 comprises optionally securing a silicon carbide (SiC) surface on the fixed stage 110, 310. In some embodiments, the silicon carbide (SiC) surface comprises the top surface 250 of a susceptor 200. Accordingly, one or more embodiments of the disclosure are directed to a support assembly 300 comprising a fixed stage, as shown in FIG. 3.

The support assembly 300 illustrated comprises a fixed stage 310, a thermal barrier 360, one or more insulating caps 320, an insulator 340, a torque plate 350 and one or more pins 330 (also referred to as machine pins).

In the illustrated embodiment, the base of the support assembly 300 is torque plate 350. The torque plate 350 of some embodiments is configured to be connected to a rotating shaft or motor (not shown). The torque plate 350 shown includes one or more openings 352 to allow pins 330 to extend from a top surface 354 of the torque plate 350.

An insulator 340 is positioned adjacent the top surface 354 of the torque plate 350. The insulator 340 of some embodiments is in direct contact with the top surface 354 of the torque plate 350. The insulator 340 illustrated includes a plurality of openings 342 extending through the thickness of the insulator 340. The bottom surface of the insulator 340 of some embodiments is positioned adjacent to and in direct contact with the top surface 354 of the torque plate 350 and configured so that the plurality of openings 342 in the insulator 340 align with the plurality of openings 352 in the torque plate 350 so that a pin 330 can pass through the insulator 340 and extend a distance from the top surface 344 of the insulator 340.

In the illustrated embodiment, one or more insulating caps 320 are positioned to cover at least a portion of the one or more pins 330 extending above the top surface 344 of the insulator 340. In the illustrated embodiment, the insulating caps 320 cover the top portion of the pins 330 so that portions of the pins 330 extending above the insulator 340 are covered with the insulating caps 320. In some embodiments, each of the pins 330 has an insulating cap 320. In some embodiments, less than all of the pins 330 has an insulating cap 320.

The thermal barrier 360 is positioned adjacent the top surface 344 of the insulator 340. The thermal barrier 360 of some embodiments includes a plurality of openings 362 sized to allow one or more of the pins 330 or insulating cap 320 to pass through.

The fixed stage 310 has a top surface 311 and a bottom surface 312 defining a thickness of the fixed stage 310. The fixed stage 310 is positioned adjacent the thermal barrier 360. In some embodiments, the fixed stage 310 is positioned so that the bottom surface 312 of the fixed stage 310 is in contact with the top surface 364 of the thermal barrier 360. In some embodiments, the fixed stage 310 includes a plurality of opening 314 sized to allow one or more of the pins 330 or insulating cap 320 to pass through. In some embodiments, the openings 314 in the fixed stage 310 are aligned with the openings 362 in the thermal barrier 360. In some embodiments, the openings 314 in the fixed stage 310 are aligned with the openings 342, 352 in the insulator 340 and the torque plate 350.

In some embodiments, the fixed stage 310 is isolated from electric ground by insulator 340 and/or insulating caps 320. In some embodiments, the one or more pins 330 are electrically separated from the fixed stage 310 by the one or more insulating caps 320.

The insulating caps 320 can be made of any suitable material that can electrically separate the fixed stage 310 from the pin 330. In some embodiments, the one or more insulating caps 320 comprise Teflon® or polytetrafluoroethylene (PTFE), or other insulating polymer.

The insulator 340 can be any suitable insulating material that can prevent electrical contact between the fixed stage 310 and the thermal barrier 360 or torque plate 350. In some embodiments, the insulator 340 comprises Teflon® or polytetrafluoroethylene (PTFE), or other insulating polymer.

The thermal barrier 360 can be any suitable material capable of thermally separating the fixed stage 310 from the torque plate 350 or insulator 340. In some embodiments, the thermal barrier 360 comprises quartz.

In one or more embodiments, the susceptor 200 (or other component) is secured to the fixed stage 310. In one or more embodiments, the susceptor 200 and the fixed stage 310 are separated from electrical ground by the one or more insulating caps 320 so that the susceptor 200 (or other component) is floating.

In some embodiments, the one or more pins 330 are fitted in the one or more torque plate openings 352 and extend through the one or more openings 342 in the insulator 340 and into the one or more insulating caps 320. In some embodiments, the one or more insulating caps 320 extend from the thermal barrier 360, the fixed stage 310 and into the susceptor 200 (or other component) as shown.

In some embodiments, as shown in FIG. 3, the support assembly 300 further comprises a support post 370. The support post 370 of some embodiments is configured to lift and/or lower the support assembly 300 along the central axis 390 and/or rotate the support assembly 300 around central axis 390. In some embodiments, the support post 370 is operably connected to one or more motors and/or actuators to move or rotate the support post 370.

Referring again to FIG. 1, the method 100 includes generating plasma 120. In some embodiments, the plasma is generated using a plasma nozzle which is part of a plasma treatment apparatus 400 (described below with respect to FIG. 4). The method 100 of some embodiments further comprises treating the top surface of the susceptor 200 (or other component) with plasma.

Figure 4:
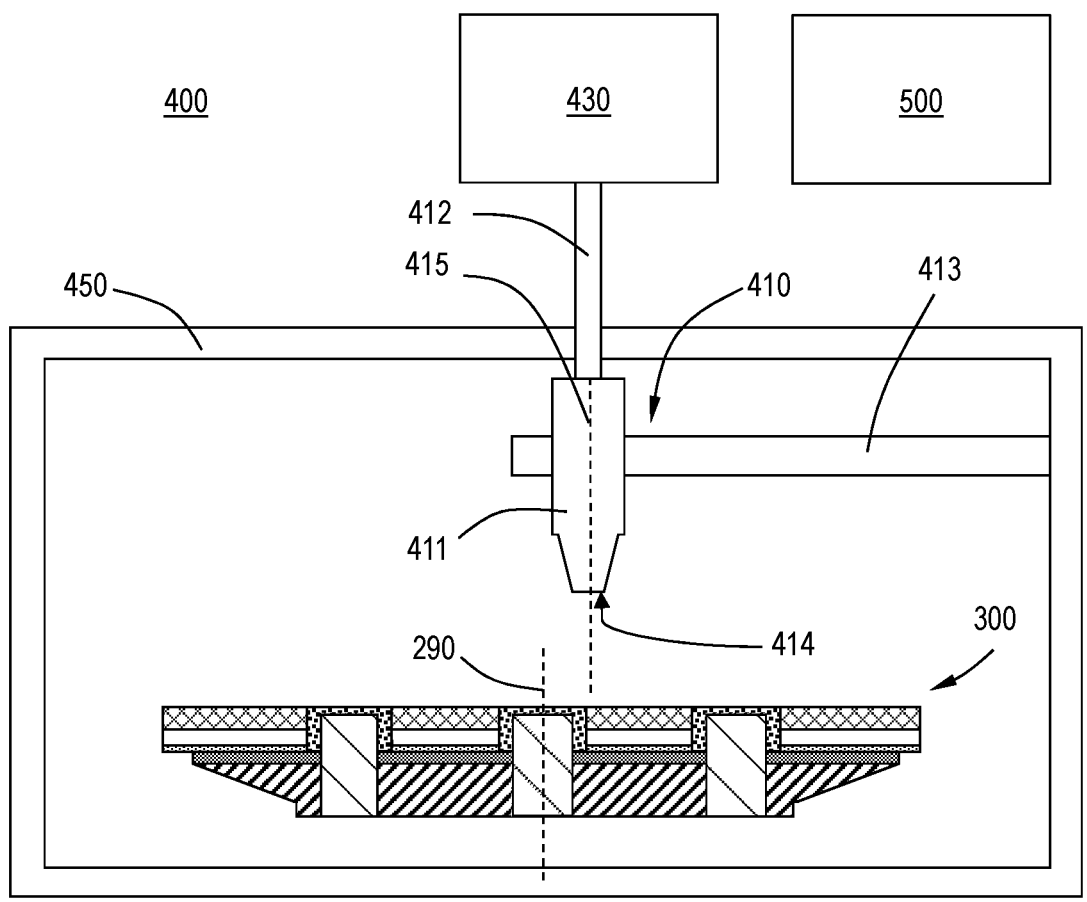
FIG. 4 illustrates a schematic cross-sectional view of a plasma treatment apparatus according to one or more embodiment of the disclosure.

FIG. 4 shows a schematic representation of a plasma treatment apparatus 400 according to one or more embodiment of the disclosure. In some embodiments, the plasma treatment apparatus 400 comprises a plasma treatment assembly 410 and the support assembly 300. In some embodiments, the plasma treatment apparatus 100 further comprises a power supply. In some embodiments, the plasma treatment assembly 410 and support assembly 300 are positioned within a processing chamber 450.

In some embodiments, the plasma treatment assembly 410 comprises a plasma nozzle 411 connected to a plasma nozzle arm 413. In one or more embodiments, the plasma nozzle arm 413 is configured to move the plasma nozzle 411 in one or more of an x-axis, y-axis or z-axis direction. Stated differently, in some embodiments, the plasma nozzle arm 413 is configured to move the plasma nozzle 411 along a path parallel to a surface or material being treated.

Figure 5:
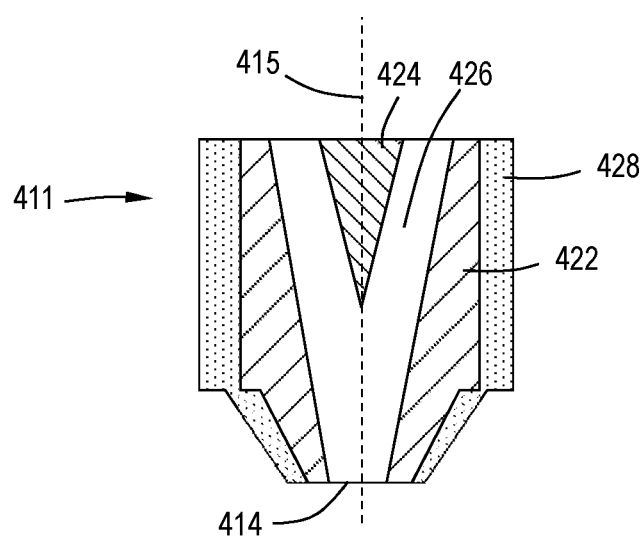
FIG. 5 illustrates an expanded schematic cross-sectional view of a plasma nozzle according to one or more embodiments of the disclosure.

FIG. 5 shows a schematic view of a plasma nozzle 411 according to one or more embodiment of the disclosure. The plasma nozzle 411 comprises an anode 422, a cathode 424 with a gas flow path 426 between. The gas flow path 426 of the plasma nozzle 411 is connectable to the gas inlet 412 so that a gas can flow through the plasma nozzle 411 in the space between the anode 422 and cathode 424 and out the plasma outlet 414. In some embodiments, the gas flow path 426 separates the anode 422 and cathode 424 so that a plasma is generated in the gas flow path prior to exiting the plasma outlet 414. In some embodiments, the plasma outlet 414 and gas flow path 426 are configured so that a plasma stream exits the plasma outlet 414 at an angle relative to a central axis 415 of the plasma nozzle 411. In some embodiments, the angle is in a range of from 1° to 20°, from 1° to 15°, from 1° to 10°, from 1° to 5°, from 2° to 20°, from 2° to 15°, from 2° to 10° or from 2° to 5°.

The embodiment illustrated in FIG. 5 has the anode 422 arranged around the cathode 424. The skilled artisan will recognize that the relative positions of these electrodes can be reversed so that the anode is within the cathode. The embodiment illustrated in FIG. 5 has a symmetrical arrangement so that the gas flowing through the plasma nozzle 411 exits the plasma outlet 414 at an angle perpendicular to the material being treated or along a path aligned with the central axis 415 of the plasma nozzle 411. In some embodiments, the anode 422 and cathode 424 are within a separate housing 428.

In some embodiments, the plasma outlet 414 has any number or variety of openings to expel plasma toward the top susceptor or the fixed stage 310. In some embodiments, the plasma outlet 414 is configured to rotate around a nozzle central axis 115. In some embodiments, the nozzle central axis 115 is aligned with the central axis 290 of the support assembly 200. In some embodiments, the plasma outlet 114 is configured to rotate around the nozzle central axis 115 at a speed of ranging from 1000 rpm to 6000 rpm, or in the range of 2000 rpm to 5000 rpm, or in the range of 2500 rpm to 3500 rpm or in the range of 2700 rpm to 3000 rpm.

In one or more embodiments, the nozzle 411 comprises of a material having one or more of low resistivity or low work function property. In some embodiments, the low resistivity is in a range of 12 to 13 micro-ohms ($\mu\Omega$). In some embodiments, the low work function allows Auger electron emissions at a lower voltage. In some embodiments, the low work function property is in a range of 4.0 to 4.1 eV. In some embodiments, the material comprises tantalum. In some embodiments, the anode, the cathode or both consists essentially of tantalum.

In some embodiments, the plasma nozzle 411 is spaced a distance from the fixed stage 310. In some embodiments, the distance is in the range of from 1 mm to 20 mm, from 1 mm to 18 mm, from 1 mm to 15 mm, from 1 mm to 12 mm, from 1 mm to 10 mm, from 1 mm to 8 mm, from 1 mm to 5 mm, 2 mm to 20 mm, from 2 mm to 18 mm, from 2 mm to 15 mm, from 2 mm to 12 mm, from 2 mm to 10 mm, from 2 mm to 8 mm or from 2 mm to 5 mm.

In some embodiments, the plasma nozzle 411 and/or the plasma nozzle arm 413 is configured to move from a central axis 290 of the fixed stage 310 to an outer edge of the component positioned on the fixed stage 310. In some embodiments, the plasma nozzle arm 413 is configured to move the plasma nozzle 411 at a speed in the range of 10 mm/sec to 50 mm/sec, or in the range of 15 mm/sec to 40 mm/sec, or in the range of 20 mm/sec to 30 mm/sec, or about 25 mm/sec.

The method 100 includes generating plasma using plasma nozzle 411. Accordingly, in one or more embodiments, the plasma is generated inside and expelled from the nozzle 411 positioned adjacent to and spaced a distance from the top surface 250 of the susceptor 200 (or other component). In some embodiments, the distance between the nozzle 411 and the top surface 250 is in the range of from 1 mm to 20 mm, from 1 mm to 18 mm, from 1 mm to 15 mm, from 1 mm to 12 mm, from 1 mm to 10 mm, from 1 mm to 8 mm, from 1 mm to 5 mm, 2 mm to 20 mm, from 2 mm to 18 mm, from 2 mm to 15 mm, from 2 mm to 12 mm, from 2 mm to 10 mm, from 2 mm to 8 mm or from 2 mm to 5 mm.

In one or more embodiments, an each portion of the top surface 250 is exposed to the plasma for a time duration in a range of from 0.5 sec to 60 sec, from 1 sec to 60 sec, from 5 sec to 60 sec, from 10 sec to 60 sec, from 20 sec to 60 sec, from 30 sec to 60 sec or from 45 sec to 60 sec.

In some embodiments, the method 100 causes an increase in the hydrophilicity of the treated component. For example, a silicon carbide coated graphite susceptor treated with plasma treatment apparatus 400 has an increased hydrophilicity as measured by contact angle goniometry. In some embodiments, the contact angle of the treated silicon carbide surface is in the range of 0 to 5°.

In some embodiments, the method 100 causes an improvement in wettability of the treated component. For example, the wettability of a silicon carbide coated graphite susceptor treated with plasma treatment apparatus 400 can be measured with a wetting angle meter (e.g., Surface Analyst Model #SA3001 from BTG Labs). In some embodiments, film adhesion is determined by susceptor lifetime in a production chamber before peeling. In some embodiments, a graphite susceptor treated with plasma treatment apparatus 400 has a mean-time-before-change (MTBC) increase of greater than or equal to 10%, 20%, 25%, 30% or 33%. In some embodiments, the MTBC increases to a film deposition thickness greater than or equal to 120 μm, 130 μm, 140 μm, 150 μm or 160 μm.

In some embodiments, the plasma nozzle 411 is connected to a location tracking system that monitors the plasma exposure to each portion of the top surface 250. In some embodiments, the location tracking system is incorporated into a control circuit or a tracking processor. In one or more embodiments, the tracking processor controls the movement of the plasma nozzle arm 413. In some embodiments, the location tracking system is configured to control and/or monitor the rotation of the support assembly 300 on the support post 370.

In one or more embodiments, the gas inlet 412 is operatively connected to a gas supply assembly 430. The specific type of gas supply assembly 430 used can vary depending on the particular process being used. Embodiments of the disclosure can be used with any type of gas or combination. In some embodiments, the gas supply assembly 430 provides a synthetic dry air to the gas inlet. In some embodiments, the synthetic dry air comprises oxygen and nitrogen. In some embodiments, the synthetic dry air comprises oxygen and nitrogen in a ratio of ranging from 20:80 to 24:76 or about 22:78.

According to one or more embodiments, the processing chamber 450 further comprises one or more of a vacuum outlet and an inert gas inlet. In some embodiments, the processing chamber 450 is continuously under vacuum or "load lock" conditions, and is not exposed to ambient air when treating the top susceptor surface 250. In some embodiments, the vacuum is maintained by operatively connecting the vacuum outlet to a vacuum source. In some embodiments, the processing chamber 450 is maintained under an inert environment. In some embodiments, the inert environment is maintained by operatively connecting the inert gas inlet to an inert source.

In some embodiments, a controller 500 may be provided and coupled to various components of the plasma treatment apparatus 400 to control the operation thereof. The controller 500 can be a single controller that controls the entire plasma treatment apparatus 400, or multiple controllers that control individual portions of the plasma treatment apparatus 400. In some embodiments, the controller includes a central processing unit (CPU), support circuits, memory, and an input/output (I/O). The controller may control the plasma treatment apparatus 400 directly, or via computers (or controllers) associated with particular process chamber and/or support system components. The controller may be one of any form of general-purpose computer processor that can be used in an industrial setting for controlling various chambers and sub-processors. The memory or computer readable medium of the controller may be one or more of readily available memory such as random access memory (RAM), read only memory (ROM), floppy disk, hard disk, optical storage media (e.g., compact disc or digital video disc), flash drive, or any other form of digital storage, local or remote. The support circuits are coupled to the CPU for supporting the processor in a conventional manner. These circuits include cache, power supplies, clock circuits, input/output circuitry and subsystems, and the like. One or more processes may be stored in the memory as software routine that may be executed or invoked to control the operation of the plasma treatment apparatus 400 or individual components in the manner described herein. The software routine may also be stored and/or executed by a second CPU that is remotely located from the hardware being controlled by the CPU. The input/output can include keyboards, computer mice, displays and/or printers.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of increasing hydrophilicity of a silicon carbide (SiC) susceptor surface, the method comprising exposing the silicon carbide susceptor surface to an atmospheric plasma to create a treated surface having a water contact angle in the range of 0° to 5°, the atmospheric plasma generated inside and expelled from a nozzle positioned adjacent to and spaced a distance in the range of from 2 mm to 15 mm from the silicon carbide susceptor surface, the nozzle comprising an anode, a cathode, a gas inlet, a gas flow path and a plasma outlet, the gas flow path separating the anode from the cathode so that a plasma is generated in the gas flow path prior to exiting the plasma outlet.

2. The method of claim 1, wherein the nozzle comprises of a material having one or more of a resistivity in the range of 12 to 13 µΩ or work function in the range of 4.0 to 4.1 eV.

3. The method of claim 2, wherein the material comprises tantalum.

4. The method of claim 3, wherein both the anode and the cathode consist essentially of tantalum.

5. The method of claim 4, wherein the silicon carbide susceptor surface is a top surface of a semiconductor manufacturing process chamber susceptor.

6. The method of claim 5, wherein the susceptor is isolated from electrical ground.

7. The method of claim 1, wherein the treated surface has an atomic oxygen content in the range of 40% to 60%.

8. The method of claim 1, wherein exposing the silicon carbide susceptor surface to the atmospheric plasma causes 90% of added atomic oxygen to penetrate the surface to a depth of up to 30 nm.

9. The method of claim 1, wherein the plasma outlet and gas flow path are configured so that a plasma stream exits the plasma outlet at an angle relative to a central axis of the plasma nozzle in the range of 1° to 20°.

10. The method of claim 1, wherein the plasma outlet is configured to rotate around a central axis of the nozzle.

11. The method of claim 10, wherein the plasma outlet rotates around the central axis of the nozzle at a speed in the range of 1000 rpm to 6000 rpm.

12. The method of claim 1, wherein the atmospheric plasma comprises oxygen and nitrogen in a ratio in the range of 20:80 to 24:76.

13. A method of increasing hydrophilicity of a silicon carbide (SiC) surface, the method comprising exposing the silicon carbide surface to an atmospheric plasma comprising oxygen and nitrogen in a ratio in the range of 20:80 to 24:76, wherein exposing the silicon carbide surface to the atmospheric plasma creates a surface with a water contact angle in the range of 0° to 5°.

14. The method of claim 13, wherein exposing the silicon carbide surface to the atmospheric plasma creates a surface with an atomic oxygen content in the range of 40% to 60%.

15. The method of claim 13, wherein the plasma is generated inside and expelled from a nozzle positioned adjacent to and spaced a distance from the silicon carbide surface, the nozzle comprising an anode, a cathode, a gas inlet, a gas flow path and a plasma outlet, the gas flow path separating the anode and cathode so that a plasma is generated in the gas flow path prior to exiting the plasma outlet, the plasma outlet configured to rotate around a central axis of the nozzle.

* * * * *